(12) United States Patent
Chong et al.

(10) Patent No.: US 10,547,290 B2
(45) Date of Patent: Jan. 28, 2020

(54) MULTI-RADIO FRONT-END CIRCUITRY FOR RADIO FREQUENCY IMBALANCED ANTENNA SHARING SYSTEM

(71) Applicant: Apple Inc., Cupertino, CA (US)

(72) Inventors: Chia Yiaw Chong, San Jose, CA (US); Mohit Narang, Cupertino, CA (US); Peter M. Agboh, Burlingame, CA (US); Hsin-Yuo Liu, Fremont, CA (US); Sultan R. Helmi, Cupertino, CA (US); Tursunjan Yasin, Santa Clara, CA (US); Ye Chen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/703,703

(22) Filed: Sep. 13, 2017

(65) Prior Publication Data
US 2019/0081614 A1    Mar. 14, 2019

(51) Int. Cl.
*H03H 11/24* (2006.01)
*H04B 1/00* (2006.01)
*H04B 1/50* (2006.01)
*H04B 1/525* (2015.01)

(52) U.S. Cl.
CPC .......... *H03H 11/245* (2013.01); *H04B 1/006* (2013.01); *H04B 1/50* (2013.01); *H04B 1/525* (2013.01); *H04M 2250/02* (2013.01)

(58) Field of Classification Search
CPC .... H03H 11/24; H03H 11/245; H04B 1/0053; H04B 1/0057; H04B 1/006; H01Q 9/04
USPC ........................................................ 327/308
See application file for complete search history.

(56) References Cited

U.S. PATENT DOCUMENTS

| | | | |
|---|---|---|---|
| 8,131,226 B1* | 3/2012 | Kemmochi | H04B 1/006 333/100 |
| 2002/0009982 A1 | 1/2002 | Kim | |
| 2003/0050100 A1 | 3/2003 | Dent | |
| 2010/0311339 A1* | 12/2010 | Chung | H04B 1/0053 455/41.3 |
| 2011/0053525 A1 | 3/2011 | Yi | |

(Continued)

FOREIGN PATENT DOCUMENTS

| | | |
|---|---|---|
| EP | 1408619 A2 | 4/2004 |
| KR | 2007011004 | 1/2007 |

OTHER PUBLICATIONS

International Search Report and Written Opinion for PCT Application No. PCT/US2018/041301 dated Sep. 25, 2018; 13 pgs.

*Primary Examiner* — Patrick C Chen
(74) *Attorney, Agent, or Firm* — Fletcher Yoder PC

(57) ABSTRACT

Systems, methods, and devices are provided to efficiently share an antenna between multiple communication systems and allow for the communication systems to be simultaneously connected to the antenna with less attenuation and/or no fluctuation in signal strength. Communication circuitry may include an antenna that transmits and receives electromagnetic radiation. The communication circuitry may also include an antenna port that provides primary access to the antenna with a first attenuation via an antenna port input. Additionally, the communication circuitry may include a coupler attached to the antenna port. The coupler may provide secondary access to the antenna with a second attenuation.

20 Claims, 16 Drawing Sheets

(56) References Cited

U.S. PATENT DOCUMENTS

2013/0071112 A1 3/2013 Melester et al.
2013/0090080 A1 4/2013 Schmidt

* cited by examiner

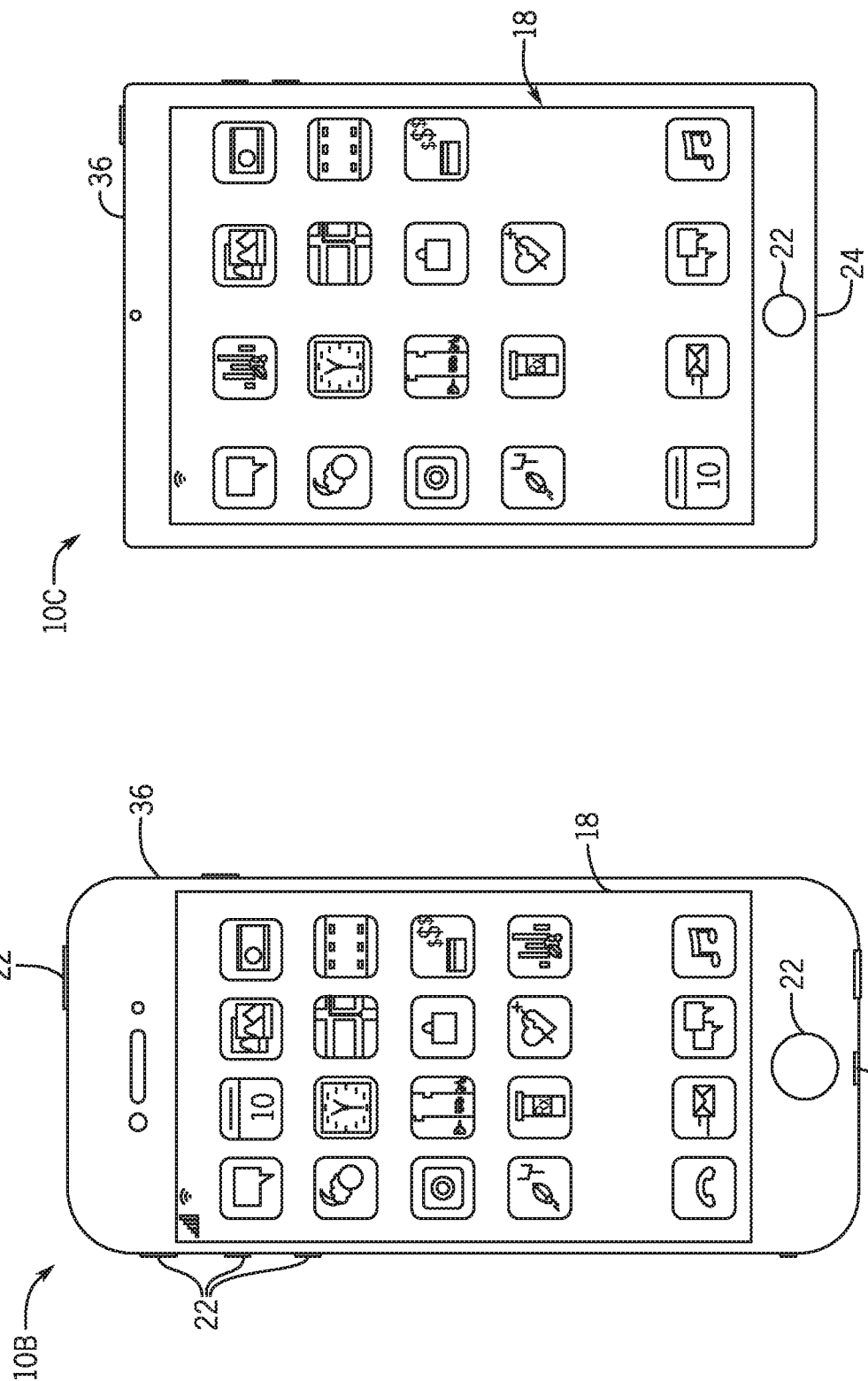

MULTI-RADIO FRONT-END CIRCUITRY FOR RADIO FREQUENCY IMBALANCED ANTENNA SHARING SYSTEM

BACKGROUND

The present disclosure relates to efficiently sharing an antenna between multiple communication systems in an electronic device.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices, such as smartphones and computers, include antennas that are used to for various forms of wireless communication, such as Bluetooth and Wi-Fi communication. In many of these electronic devices, circuitry may share the antenna by toggling between Wi-Fi and Bluetooth circuitry. In cases in which a device has multiple wireless connections, the strength of the Wi-Fi or Bluetooth signal may decrease owing to the simultaneous use of the antenna by the Wi-Fi and Bluetooth circuitry. This decrease in signal strength could result in disconnection or dropping a packet of data from a Wi-Fi and/or Bluetooth network.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Electronic devices may have an antenna that is shared by multiple communication systems, such as Wi-Fi and Bluetooth communication systems. To avoid excessive attenuation in signal strength when these communication systems are both in use, routing circuitry may route signals for a first communication system (e.g., Bluetooth) through an antenna port while routing signals for second communication system (e.g., Wi-Fi) through a coupler attached to the antenna port. Although the coupler may attenuate the signals for the second communication system, the coupler may allow for a simultaneous connection to the antenna by both communication systems with less attenuation than other types of components that could be used for accessing the antenna port.

For example, the routing circuitry may include a first switch that is coupled to the first communication system and the coupler. The routing circuitry may also include a second switch that is coupled to the second communication system and the antenna port. The routing circuitry may route communication through the antenna port by the first or the second communication systems unless both are active. In that case, the routing circuitry may route communication associated with the first communication system through the coupler and communication associated with the second communication system through the antenna port.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 3 is a front view of a hand-held device representing another embodiment of the electronic device of FIG. 1, in accordance with an embodiment;

FIG. 4 is a front view of another hand-held device representing another embodiment of the electronic device of FIG. 1, in accordance with an embodiment;

DETAILED DESCRIPTION

One or more specific embodiments of the present disclosure will be described below. These described embodiments are only examples of the presently disclosed techniques.

Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Electronic devices may use an antenna for multiple communication systems, such as Wi-Fi and Bluetooth communication systems. These devices may experience attenuation in signal strength that may result in the disconnection of the device from a Wi-Fi and/or Bluetooth network. Embodiments of the present disclosure relate to systems and methods that allow electronic devices to use a shared Wi-Fi and Bluetooth antenna to communicate via Wi-Fi and Bluetooth at the same time with less attenuation.

Figure 1:
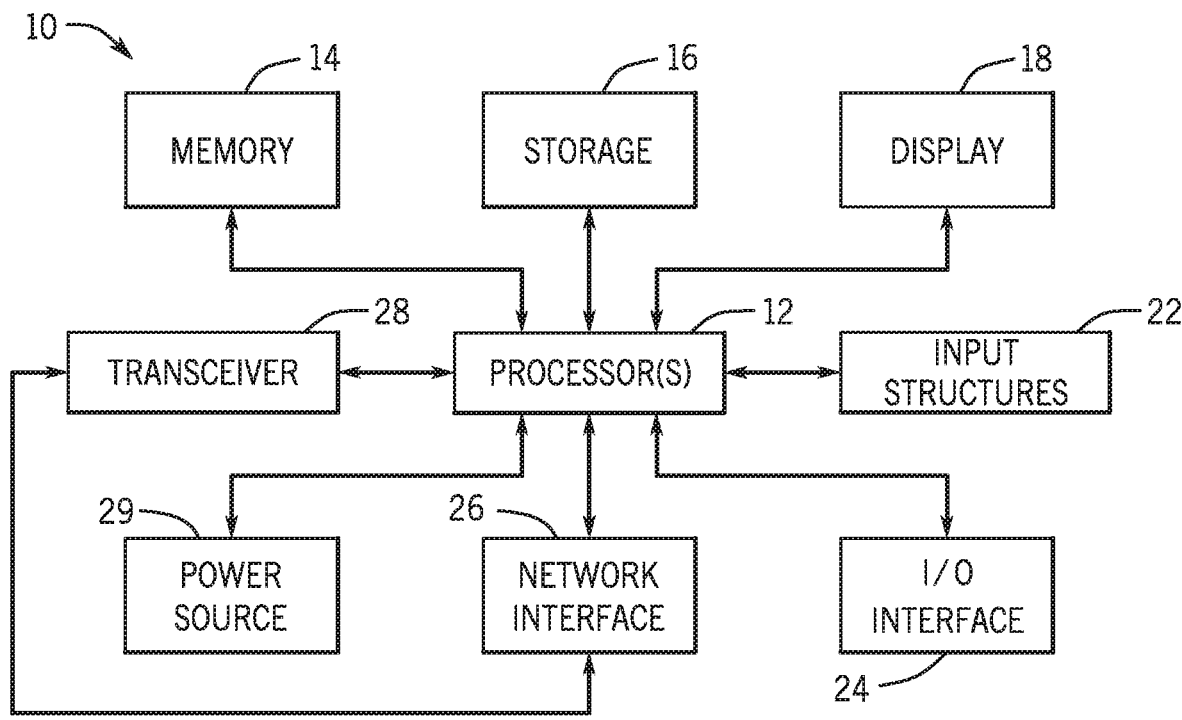
FIG. 1 is a schematic block diagram of an electronic device, in accordance with an embodiment.

With the foregoing in mind, a general description of suitable electronic devices that may employ an overdrive to provide an improved response to changed display settings is discussed herein. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a transceiver 28, and a power source 29. The various functional blocks shown in FIG. 1 may include hardware elements (including circuitry), software elements (including computer code stored on a computer-readable medium) or a combination of both hardware and software elements. For example, as discussed in greater detail below, the memory 14 may include software instructions associated with an overdrive 30 that when executed by the one or more processors 12 causes a portion of the display 18 to be commanded to have certain characteristics that differ from an intended set of characteristics. It should be noted that FIG. 1 is merely one example of a particular implementation and is intended to illustrate the types of components that may be present in electronic device 10.

Figure 2:
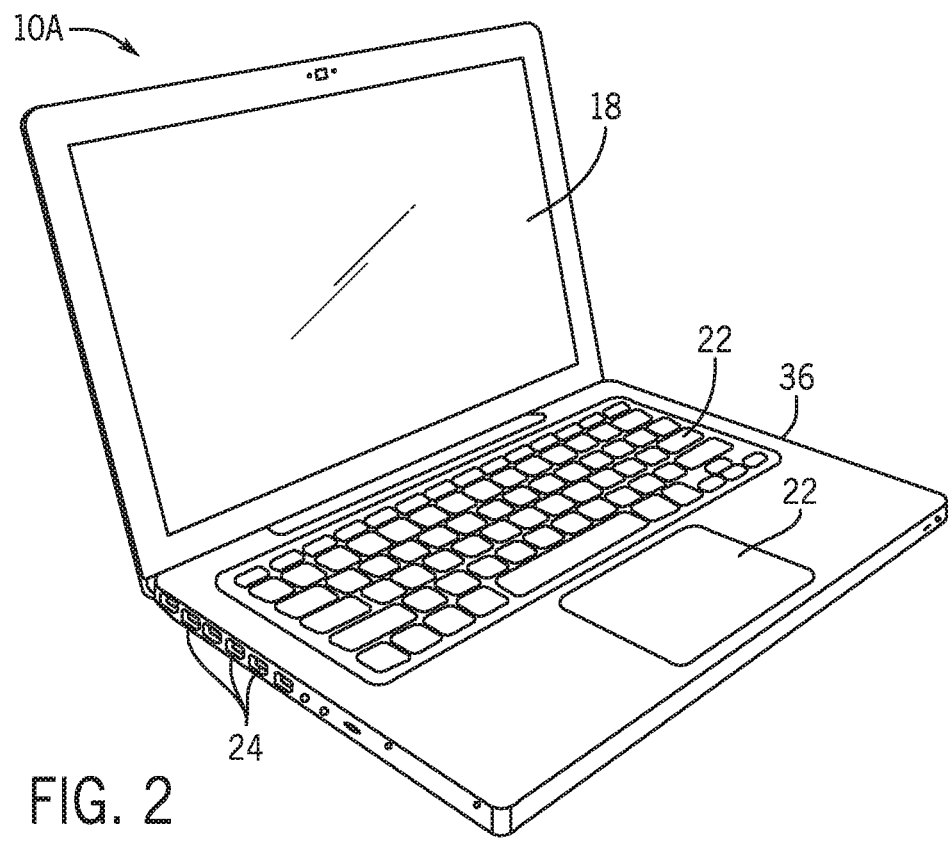
FIG. 2 is a perspective view of a notebook computer representing an embodiment of the electronic device of FIG. 1, in accordance with an embodiment.
Figure 5:
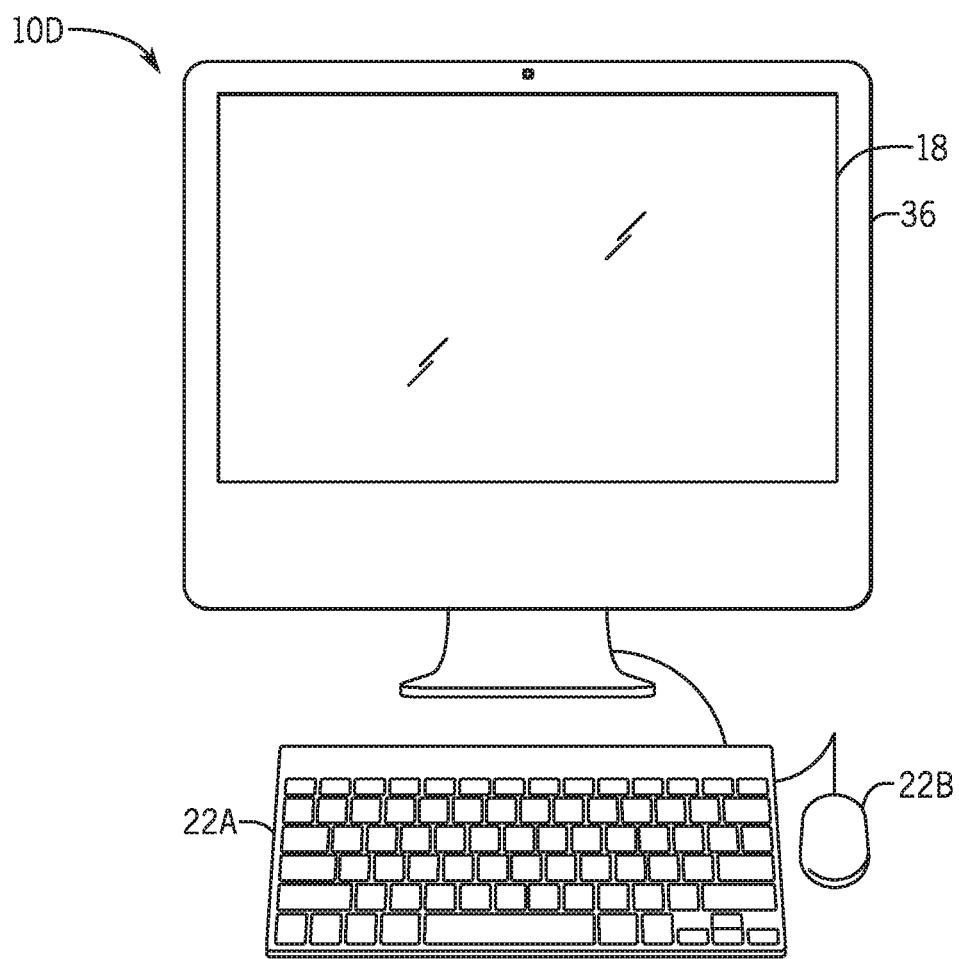
FIG. 5 is a front view of a desktop computer representing another embodiment of the electronic device of FIG. 1, in accordance with an embodiment.
Figure 6:
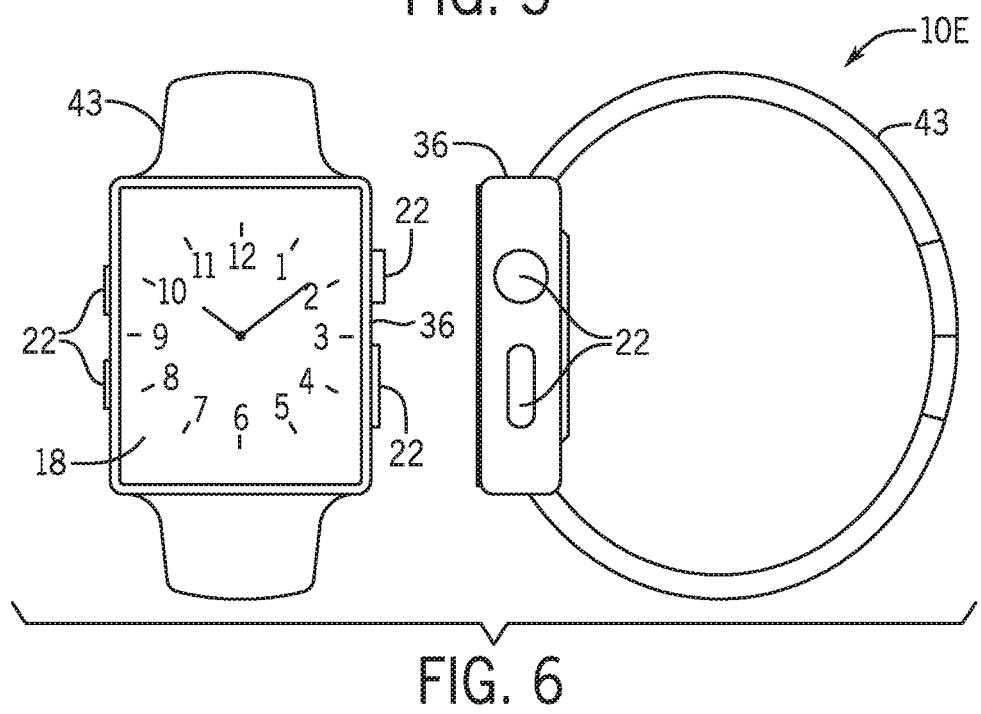
FIG. 6 is a front view and side view of a wearable electronic device representing another embodiment of the electronic device of FIG. 1, in accordance with an embodiment.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry". Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of liquid crystal display (LCD) panels and OLED panels. The display 18 may receive images, data, or instructions from processor 12 or memory 14, and provide an image in display 18 for interaction. More specifically, the display 18 includes pixels, and each of the pixels may be set to display a color at a brightness based on the images, data, or instructions from processor 12 or memory 14.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, long term evolution (LTE) cellular network, or long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include any circuitry that may be useful in both wirelessly receiving and wirelessly transmitting signals (e.g., data signals). Indeed, in some embodiments, as will be further appreciated, the transceiver 28 may include a transmitter and a receiver combined into a single unit, or, in other embodiments, the transceiver 28 may include a transmitter separate from the receiver. Indeed, in some embodiments, the transceiver 28 may include several transmitters and receivers, some or none of which are combined into single units. The transceiver 28 may transmit and receive OFDM signals (e.g., OFDM data symbols) to support data communication in wireless applications such as, for example, PAN networks (e.g., Bluetooth), WLAN networks (e.g., 802.11x Wi-Fi), WAN networks (e.g., 3G, 4G, and LTE cellular networks), WiMAX networks, mobile WiMAX networks, ADSL and VDSL networks, DVB-T and DVB-H networks, UWB networks, and so forth. Further, in some embodiments, the transceiver 28 may be integrated as part of the network interfaces 26. As described below, the transceiver 28 may also be used in conjunction with routing circuitry, an antenna, and a coupler (e.g., a directional coupler). As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. Enclosure 36 may also include sensing and processing circuitry that may be used to provide correction schemes described herein to provide smooth images in display 18. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
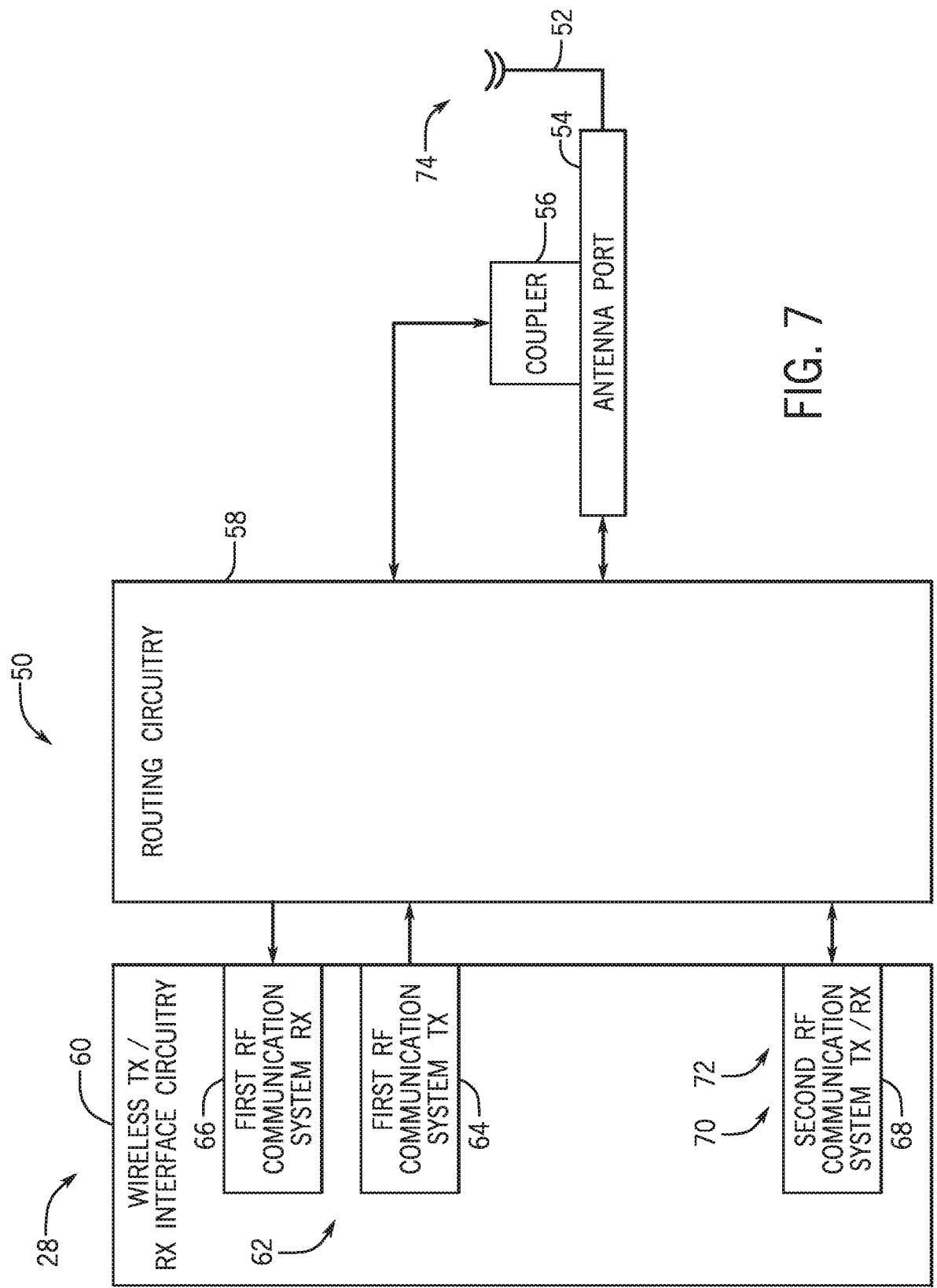
FIG. 7 is a schematic diagram of a system that enables the electronic device of FIG. 1 to communicate wirelessly, in accordance with an embodiment.
Figure 8:
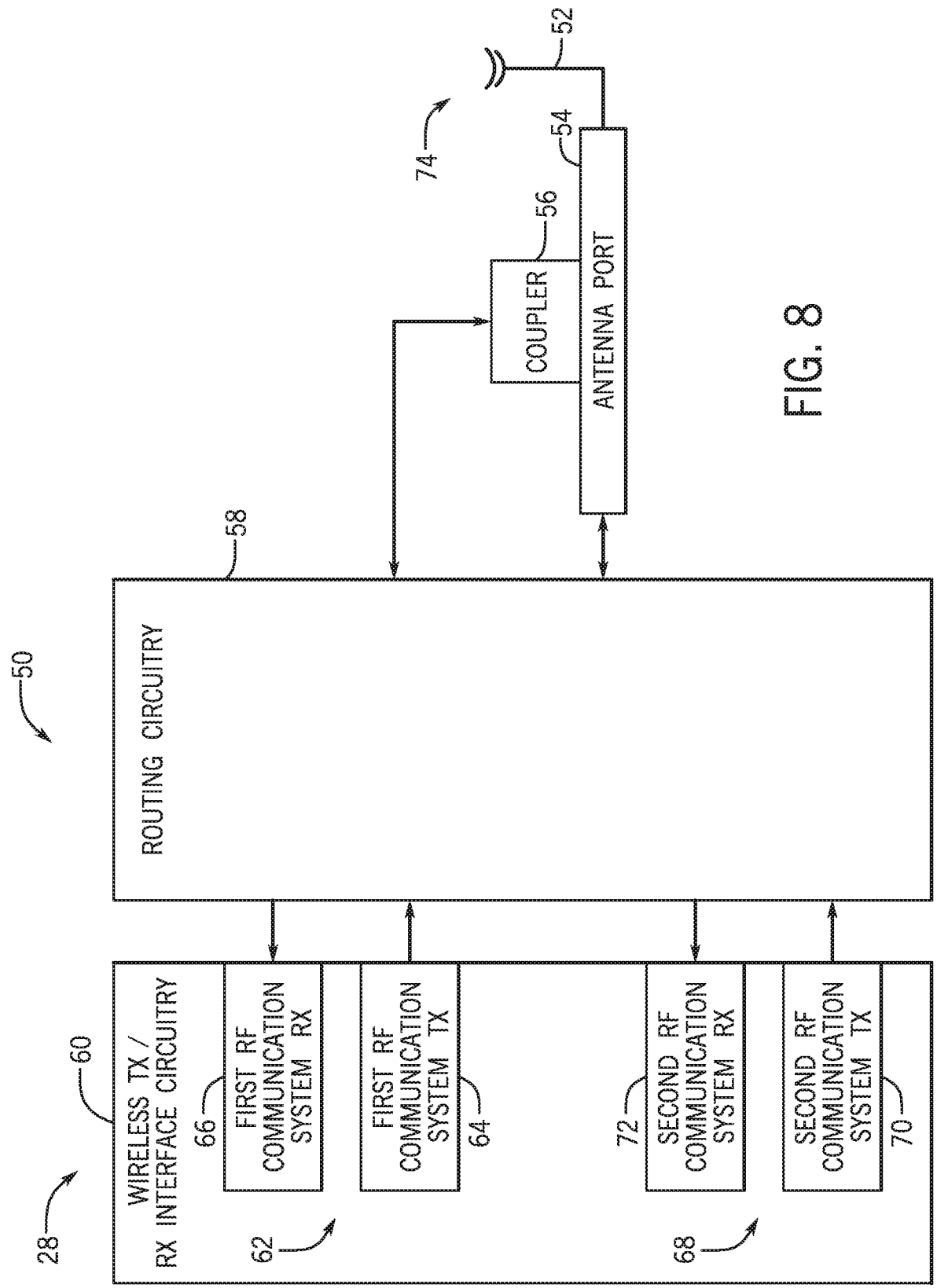
FIG. 8 is a schematic diagram of the system of FIG. 7, in accordance with an embodiment.
Figure 9:
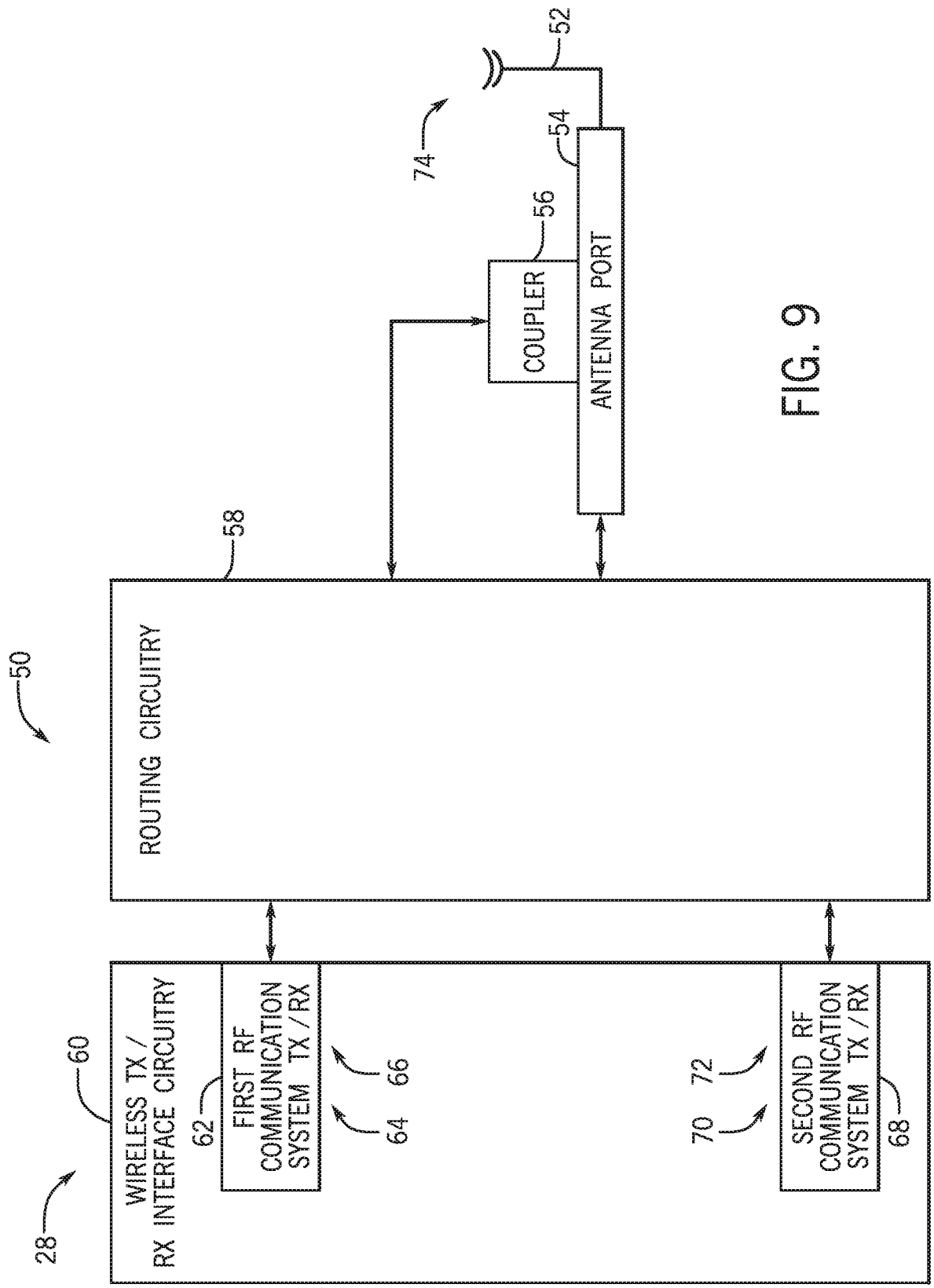
FIG. 9 is a schematic diagram of the system of FIG. 7, in accordance with an embodiment.

With the foregoing in mind, FIGS. 7-9 illustrate several embodiments of a system 50 that may include an antenna 52, antenna port 54, coupler 56, routing circuitry 58, and wireless transmitter and receiver interface circuitry 60. The system 50 may allow the electronic device 10 to wirelessly communicate via multiple networks (e.g., WLAN, PAN, and/or LTE). More specifically, FIG. 7 is a schematic diagram of an example of the system 50 in which the wireless transmitter and receiver interface circuitry 60 includes a first communication system 62 that includes a transmitter 64 and a receiver 66 that are separate from one another. In the same example, the wireless transmitter and receiver interface circuitry 60 also includes a second communication system 68 that includes a transmitter 70 and a receiver 72 that are combined into a single unit. FIG. 8 is a schematic diagram of the system 50 that differs from the example illustrated in FIG. 7 in that the transmitter 70 and receiver 72 of the second communication system 68 are separate from one another. FIG. 9 is a schematic diagram of an example of the system 50 in which the transmitter 64 and receiver 66 are combined, and the transmitter 70 and receiver 72 are also combined.

Referring collectively to the examples illustrated in FIGS. 7-9, the antenna 52 may transmit and receive electromagnetic radiation 74 such as radio waves. More specifically, the antenna 52 may receive radio waves and convert the radio waves into electrical signals that may be conveyed to the receivers 66, 72. Additionally, the antenna 52 may receive electrical signals from the transmitters 64, 70, convert the electrical signals into radio waves, and transmit the radio waves.

As illustrated, the antenna 52 is coupled to the antenna port 54. The antenna port 54 may include inputs and outputs. The inputs may receive signals from the first and second communication systems 62, 68, and the outputs may transmit signals to the first and second communication system 62, 68. For example, electromagnetic radiation 74 received by the antenna 52 may be converted to electrical signals, and one or more outputs of the antenna port 54 may transmit the signals to the receivers 66, 72.

Moreover, the coupler 56 may be coupled to the antenna port 54 and the routing circuitry 58. The coupler 56 may route electrical signals received by antenna port 54 to a destination that differs from a destination of the antenna port 54. For instance, the coupler 56 may be used to transmit and receive signals to and from the first communication system 62, while the antenna port 54 may be used to transmit and receive signals from the second communication system 68. More specifically, the coupler 56 may couple a defined amount of electrical power. The amount of power may be defined by a coupling factor, which is representative of a ratio of power output from the coupler 56 to power received via the coupler 56. The coupler 56 may have a coupling factor such as −6 decibels or −10 decibels.

The routing circuitry 58 includes circuitry that allows the wireless transmitter and receiver interface circuitry 60 to communicate with the antenna port 54 and coupler 56. As discussed in greater detail below with regard to FIG. 11-17, the routing circuitry 58 may include switches and/or amplifiers.

As mentioned above, the wireless transmitter and receiver interface circuitry 60 includes the first communication system 62 and the second communication system 68. The first communication system 62 includes the transmitter 64 and the receiver 66, and the second communication system 68 includes the transmitter 70 and the receiver 72. The transmitters 64, 70 may transmit electrical signals to antenna 52, while the receivers 66, 72 may receive signals that are initially received via the antenna 52.

The embodiments of FIGS. 7-9 may be employed to enable simultaneous Wi-Fi communication and Bluetooth communication. For example, the first communication system 62 may enable Wi-Fi communication, and the second communication system 68 may enable Bluetooth communication, and both the first and second communication systems 62 and 68 may be active (e.g., sending or receiving signals) at the same time. In one example, when communication systems 62 and 68 are both active, communication associated with the second communication system 68 may be provided primary access to the antenna 52 by routing the communication through the antenna port 54, while communication associated with the first communication system 62 may receive secondary access to the antenna 52 by routing the communication through the coupler 56. In such a case, the antenna port 54 and coupler 56 may respectively provide primary and secondary access to the antenna 52 at two different attenuations. That is, the change in power of the signals associated with passing directly through the antenna port 54 or through the coupler 56 may differ.

Each of the embodiments illustrated in FIGS. 7-9 provides less of a decrease in the signal-to-noise ratio associated with Wi-Fi communication than might otherwise occur if the coupler 56 were absent. For example, when Wi-Fi communication is active and a Bluetooth receiver (e.g., receiver 72) is active, there may be a change in the signal-to-noise ratio associated with the Wi-Fi communication of −6 decibels when the coupler 56 has a coupling factor of −6 decibels and −10 decibels when the coupler 56 has a coupling factor of −10 decibels. However, without the inclusion of the coupler 56, the change in signal-to-noise ratio might otherwise be −25 decibels. Additionally, when Wi-Fi communication is active and a Bluetooth transmitter (e.g., transmitter 70) is active, the signal-to-noise ratio may decrease by 31 decibels and 35 decibels for couplers 56 with coupling factors of −6 decibels and −10 decibels, respectively. Without a coupler 56, the change in signal-to-noise ratio could be on the order of around −50 decibels.

As another example, if a coupler 56 were not present, there could be a −25 decibel fluctuation in Wi-Fi received signal strength indication (RSSI) when the communication system (e.g., second communication system 68) that enables Bluetooth communication is idle. However, when the coupler 56 is utilized, such as in embodiments of the system 50 in which Wi-Fi communication associated with the first communication system 62 is routed through the antenna port 54 when the second communication system 68 is idle (e.g., not active), the fluctuation in Wi-Fi RSSI may be equal to the coupling factor of the coupler 56. For instance, if the coupler 56 has a coupling factor of −10 decibels, the fluctuation in Wi-Fi RSSI may be −10 decibels. However, in other embodiments, the system 50 may not cause fluctuations in Wi-Fi RSSI. For example, in embodiments in which Wi-Fi communication associated with the first communication system 62 is routed through the coupler 56 when the second communication system 68 is idle, a constant Wi-Fi signal strength may be obtained.

Moreover, the embodiments illustrated in FIGS. 7-9 allow for a constant Wi-Fi signal strength to be maintained when the communication system (e.g., first communication system 62) that enables Wi-Fi communication is active and the communication system (e.g., second communication system 68) that enables Bluetooth communication transitions between being idle, receiving data, and transmitting data. In other words, when the second communication system 68 switches between being idle, receiving data, and transmitting data, fluctuations in Wi-Fi RSSI will not occur. Additionally, because Wi-Fi RSSI is constant, variation in signal-to-noise ratio associated with Wi-Fi communication can be solely attributed to fluctuation in noise (e.g., noise produced by Bluetooth communication). Furthermore, by providing a constant Wi-Fi signal (i.e., no variation in Wi-Fi RSSI), the system 50 may better stay connected to and/or avoid dropping a packet of data from a Wi-Fi and/or Bluetooth network.

Figure 10:
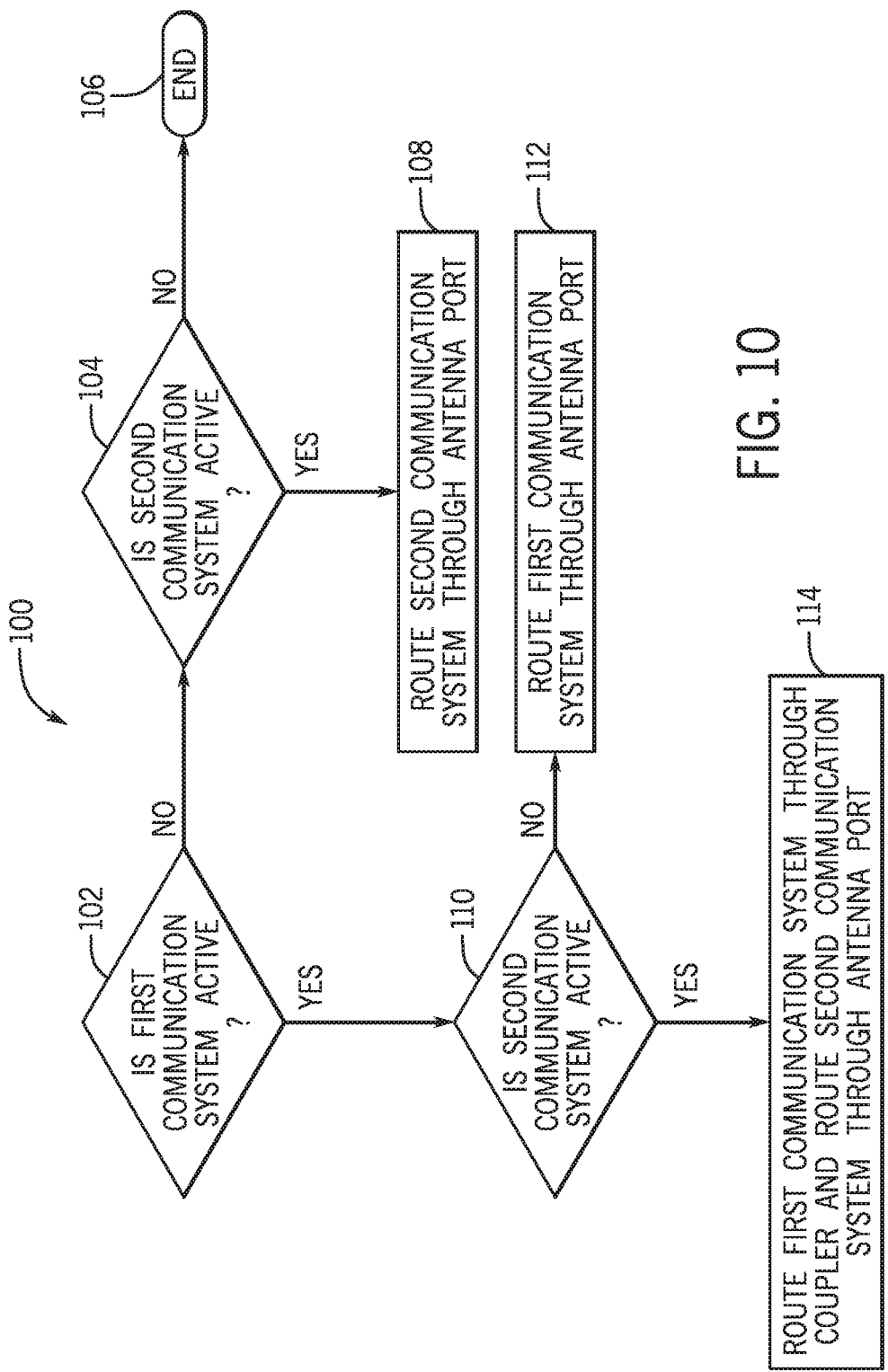
FIG. 10 is a flowchart of a method for routing communication, in accordance with an embodiment.

With the discussion of FIGS. 7-9 in mind, FIG. 10 is a flowchart of a method 100 for routing communication through the system 50. More specifically, the method 100 may be particular to the routing circuitry 58. That is, the method may be performed in whole or in part by the routing circuitry 58.

At block 102, whether the first communication system 62 is active may be determined. For example, the first communication system 62 is active when transmitting or receiving electrical signals. The first communication system 62 may also be inactive (e.g., not transmitting or receiving signals) or off.

If the first communication system is not active, at block 104, whether the second communication system 68 is active may be determined. For instance, when the second communication system 68 is transmitting or receiving signals, the second communication system 68 is considered active. If the second communication system 68 is also considered to not be active, at block 106, the method 100 ends. In other embodiments, instead of the method 100 ending, the method may return to block 102 (e.g., determine whether the first communication system 62 is active).

However, if at block 106 the second communication system 68 is found to be active, at block 108, communication of the second communication system 68 is routed through the antenna port 54. In other words, when the second communication system 68 is active and the first communication system 62 is not active, communication of the second communication system 68 is routed through the antenna port 54. The communication may be routed via the routing circuitry 58.

If at block 102, the first communication system 62 is active, at block 110, whether the second communication system 68 is active may be determined. This is similar to block 104. However, block 110 differs from block 104 in that that one is performed when the first communication system 62 is active, while the other is performed when the first communication system 62 is not active. If the second communication system is not active, communication of the first communication system 62 is routed through the antenna port 54. That is, when the first communication system 62 is active and the second communication system 68 is not active, communication of the first communication system 62 is routed through the antenna port 54.

However, if at block 110, the second communication system 68 is also active, communication associated with the first communication system 62 is routed through the coupler 56, and communication associated with the second communication system 68 is routed through the antenna port 54. In other words, when both the first communication system 62 and second communication system 68 are active, communication of the first communication system 62 may be routed through the coupler 56, while communication of the second communication system 68 may be routed through the antenna port 54.

FIGS. 11-17 illustrate more embodiments of the system 50. In each of the illustrated embodiments, the first communication system 62 enables communication via WLAN networks (e.g., via an 802.11x Wi-Fi network), while the second communication system 68 enables communication via a PAN, such as a Bluetooth network. Additionally, the embodiments shown in FIGS. 11-17 are provided to show various configurations of the routing circuitry 58. Furthermore, each embodiment of the system 50 illustrated in FIGS. 11-17 may perform the method 100.

Figure 11:
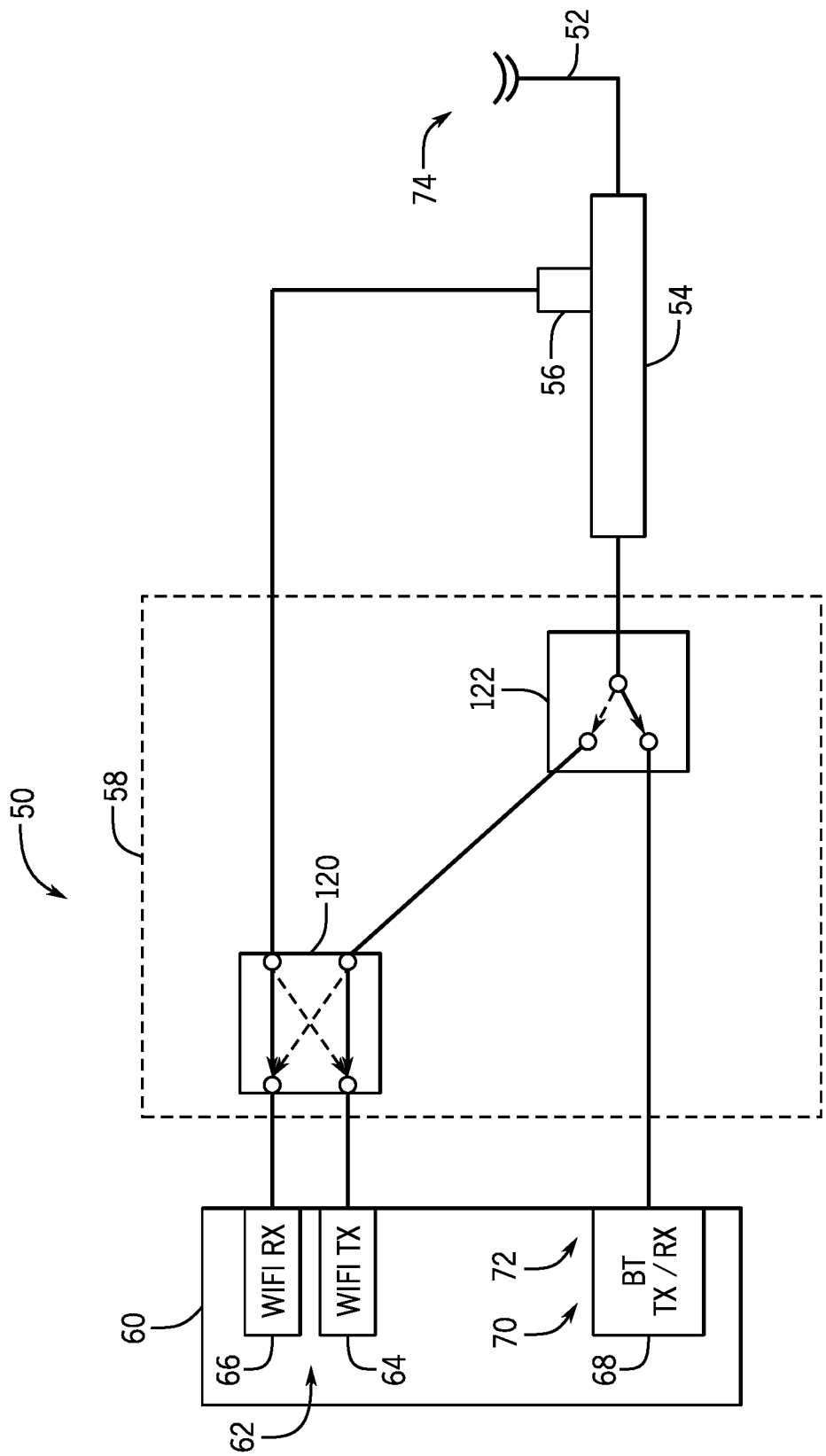
FIG. 11 is a schematic diagram of the system of FIG. 7, in accordance with an embodiment.

With this in mind, FIG. 11 is a schematic diagram of the system in which the routing circuitry includes two switches. More specifically, a first switch 120 is a double pole, double throw (DPDT) switch. As illustrated, the first switch 120 is communicatively coupled to the coupler 56 and a second switch 122. The first switch 120 is also communicatively coupled to the transmitter 64 and receiver 66 of the first communication system 62. In the illustrated embodiment, the second switch 122 is a single pole, double throw (SPDT) switch. The second switch 122 is coupled to the antenna port 54, the first switch 120, and the second communication system 68.

The first switch 120 and second switch 122 may toggle to enable communication as described above with regard to the method 100. For example, when the first communication system 62 or second communication system 68 is active, and the other is not active, communication may be routed through the antenna port 54. Moreover, when both the first communication system 62 and the second communication system 68 are active, communication associated with the first communication system 62 may be routed through the coupler (e.g., via the first switch 120), and communication associated with the second communication system 68 may be routed through the antenna port 54 (e.g., via the second switch 122).

Figure 12:
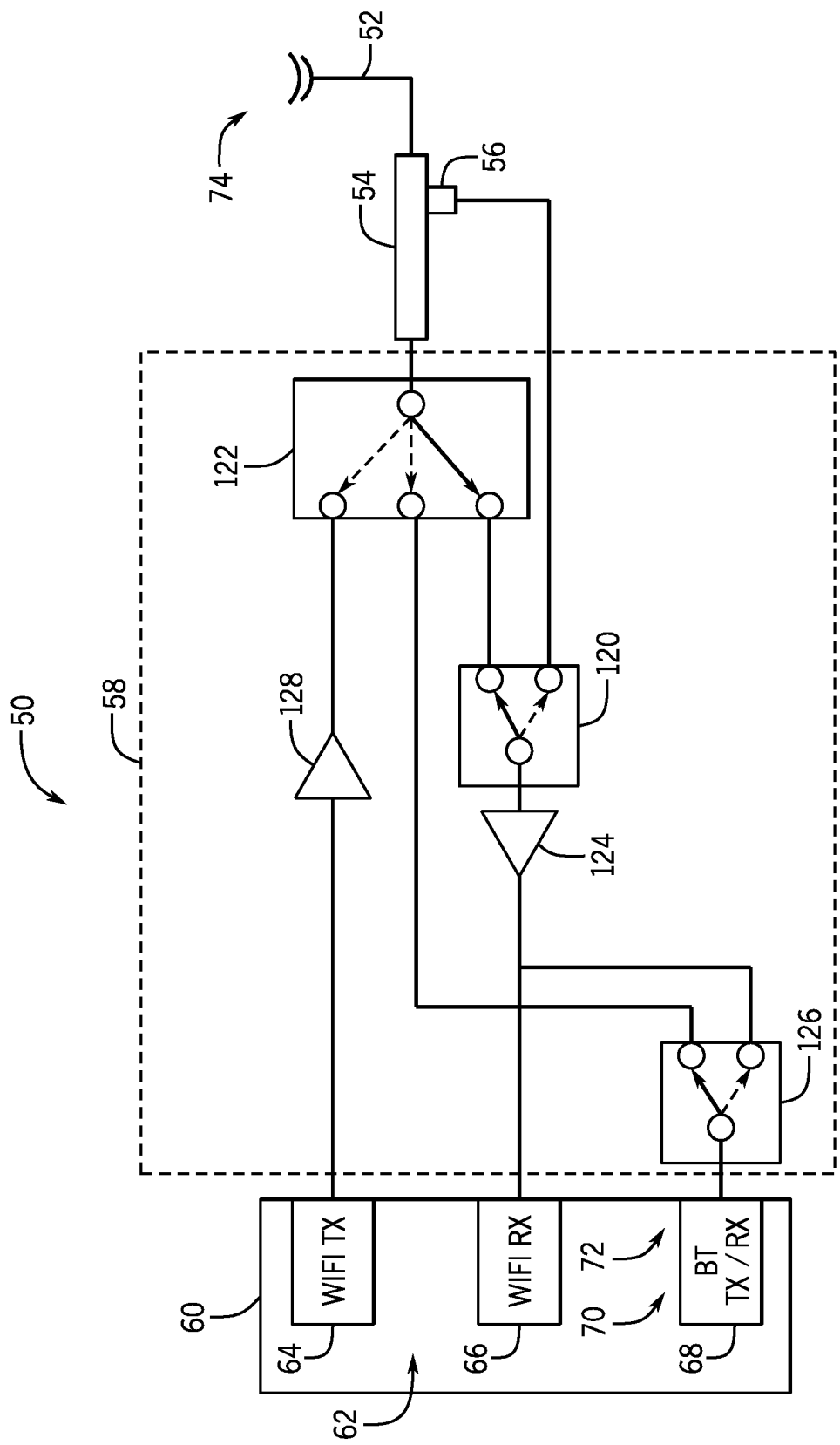
FIG. 12 is a schematic diagram of the system of FIG. 7, in accordance with an embodiment.

Continuing with the drawings, FIG. 12 is a schematic diagram of another embodiment of the system 50 that includes three switches and two amplifiers. As illustrated, the first switch 120 is a double pole, single throw (DPST) switch that is communicatively coupled to the coupler 56 and the second switch 122. The first switch 120 is also communicatively coupled to an amplifier 124, the receiver 66 of the first communication system 62, a third switch 126, and the second communication system 68. In the illustrated embodiment, the second switch 122 is a single pole, triple throw (SP3T) switch that is communicatively coupled to the antenna port 54, the transmitter 64, and an amplifier 128. Moreover, the second switch is communicatively coupled to the receiver 66 and the second communication system 68. Furthermore, the third switch 126 is a DPST switch.

The amplifiers 124, 128 increase the power of the electrical signals of the system 50. For example, the amplifier 128 may increase the power of electrical signals transmitted by the transmitter 64. In some embodiments, the amplifiers 124 may be a low noise amplifier. Low noise amplifiers amplify low power signals without degrading the signal-to-noise ratio of the power signals. For example, some low noise amplifiers may have a noise figure of three decibels or lower and provide a power gain that boosts the signal (e.g., ten decibels). In some embodiments, low noise amplifiers may have a noise figure lower than three decibels and a gain that is less than or greater than ten decibels. Electromagnetic radiation 74 may be received by the antenna 52, converted into electrical signals via the antenna 52, and may be amplified via the amplifier 124 before reaching the receiver 66 and receiver 72.

Figure 13:
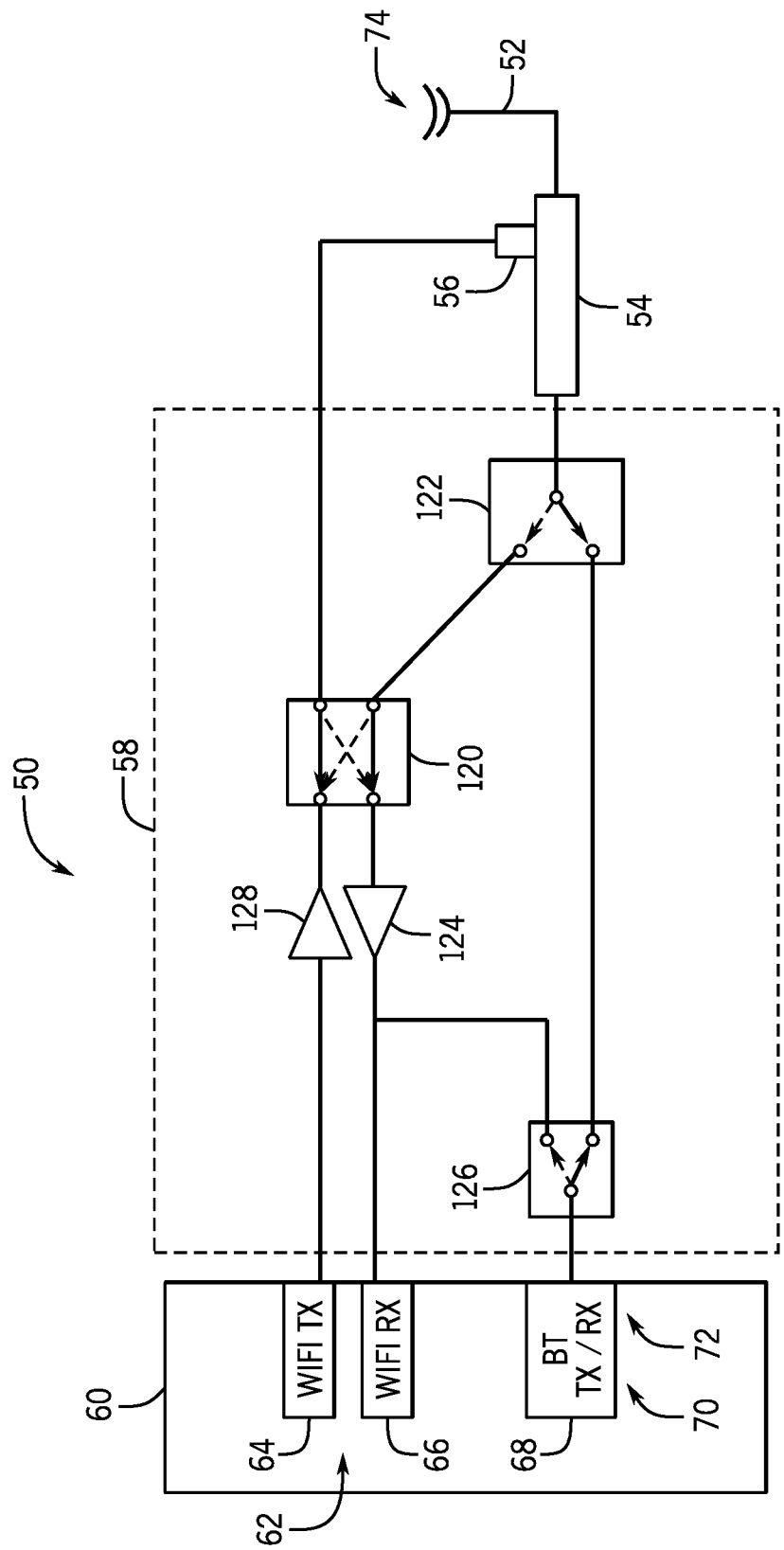
FIG. 13 is a schematic diagram of the system of FIG. 7, in accordance with an embodiment.

FIG. 13 is a schematic diagram of an embodiment of the system 50 that also includes three switches and two amplifiers. In the illustrated embodiment, the first switch 120 is a DPDT switch, the second switch 122 is a SPDT switch, and the third switch 126 is a DPST switch. Similar to the embodiment illustrated in FIG. 12, electrical signals that pass through the routing circuitry 58 may be amplified via the amplifiers 124 and 128.

Figure 14:
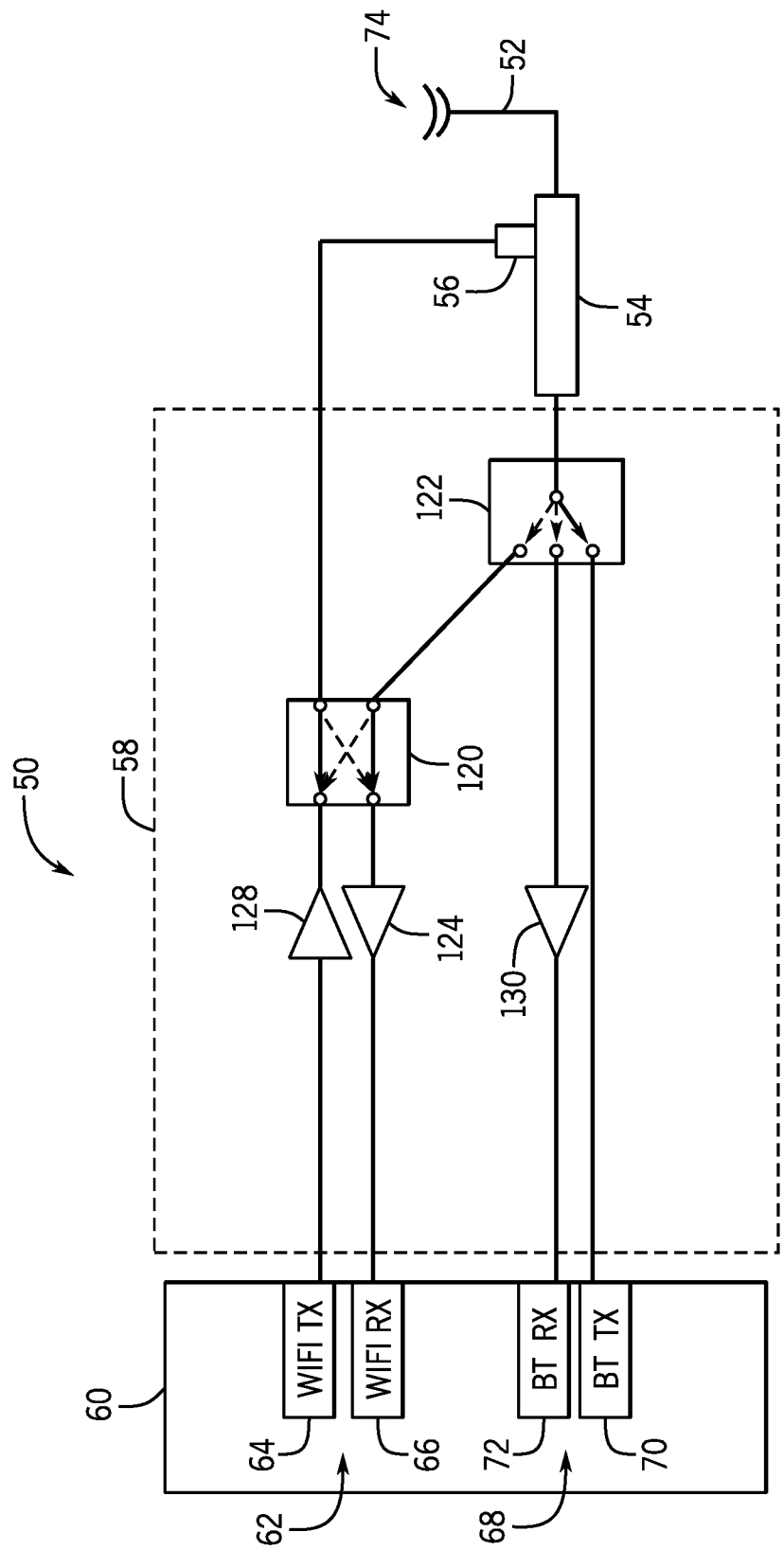
FIG. 14 is a schematic diagram of the system of FIG. 7, in accordance with an embodiment.

FIG. 14 is a schematic diagram of another embodiment of the system 50. In the illustrated embodiment, the first switch 120 is a DPDT switch, and the second switch 122 is a SP3T switch. This particular embodiment also includes three amplifiers: amplifier 124, amplifier 128 and an amplifier 130. The amplifier 130 may be a low noise amplifier, and the amplifier 130 may amplify electrical signals that are sent to the receiver 72.

Figure 15:
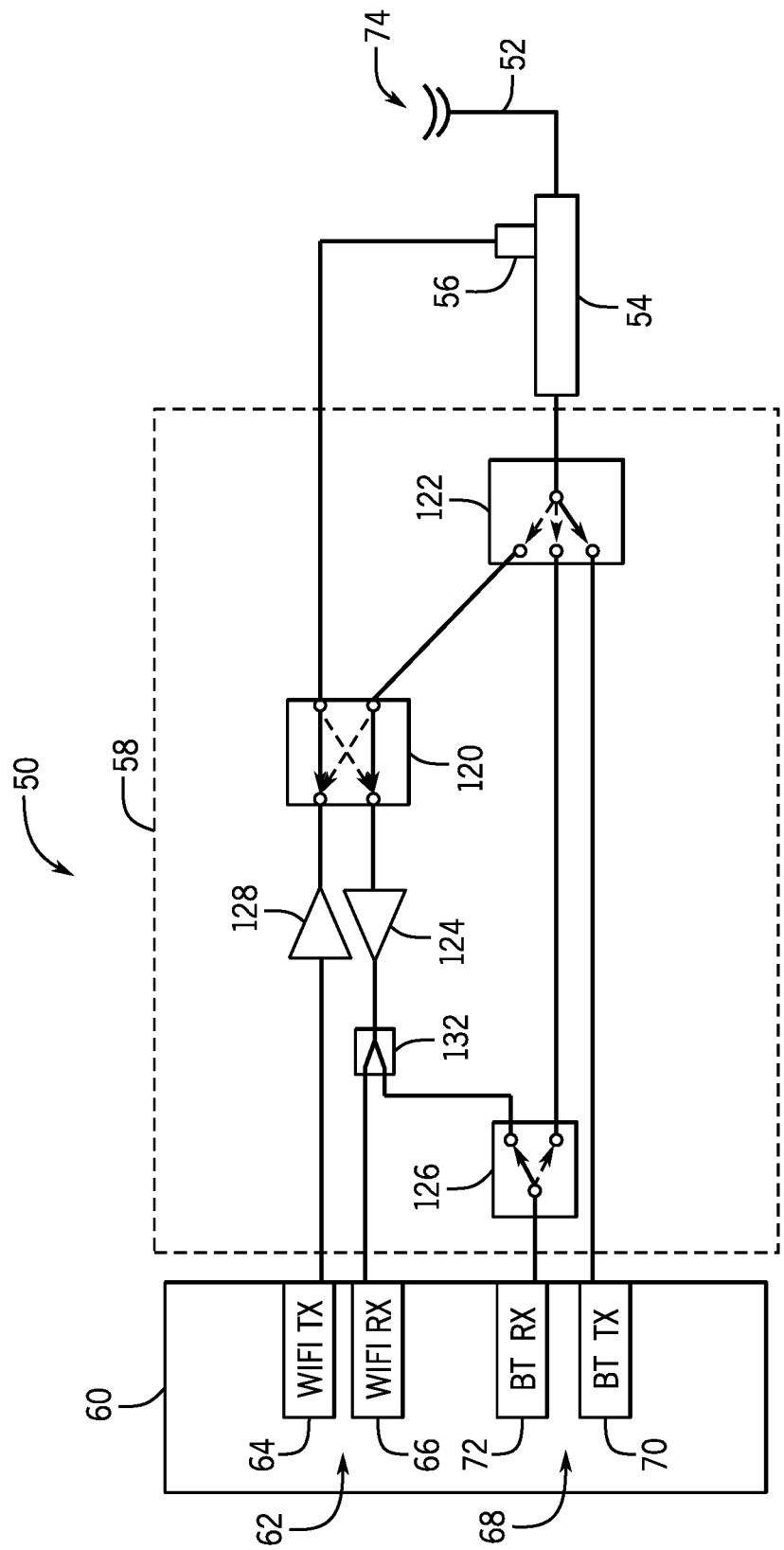
FIG. 15 is a schematic diagram of the system of FIG. 7, in accordance with an embodiment.

FIG. 15 is a schematic diagram of another embodiment of the system 50. In the illustrated embodiment, the first switch 120 is a DPDT switch, the second switch 122 is a SP3T switch, and the third switch 126 is a DPST switch. The system 50 also includes the amplifiers 124, 128. The system 50 also includes a divider 132 (e.g., a power splitter). The divider 132 may split signals that are amplified by the amplifier 124 before the signals are ultimately received by the receiver 66 of the first communication system 62 and the receiver 72 of the second communication system 68.

Figure 16:
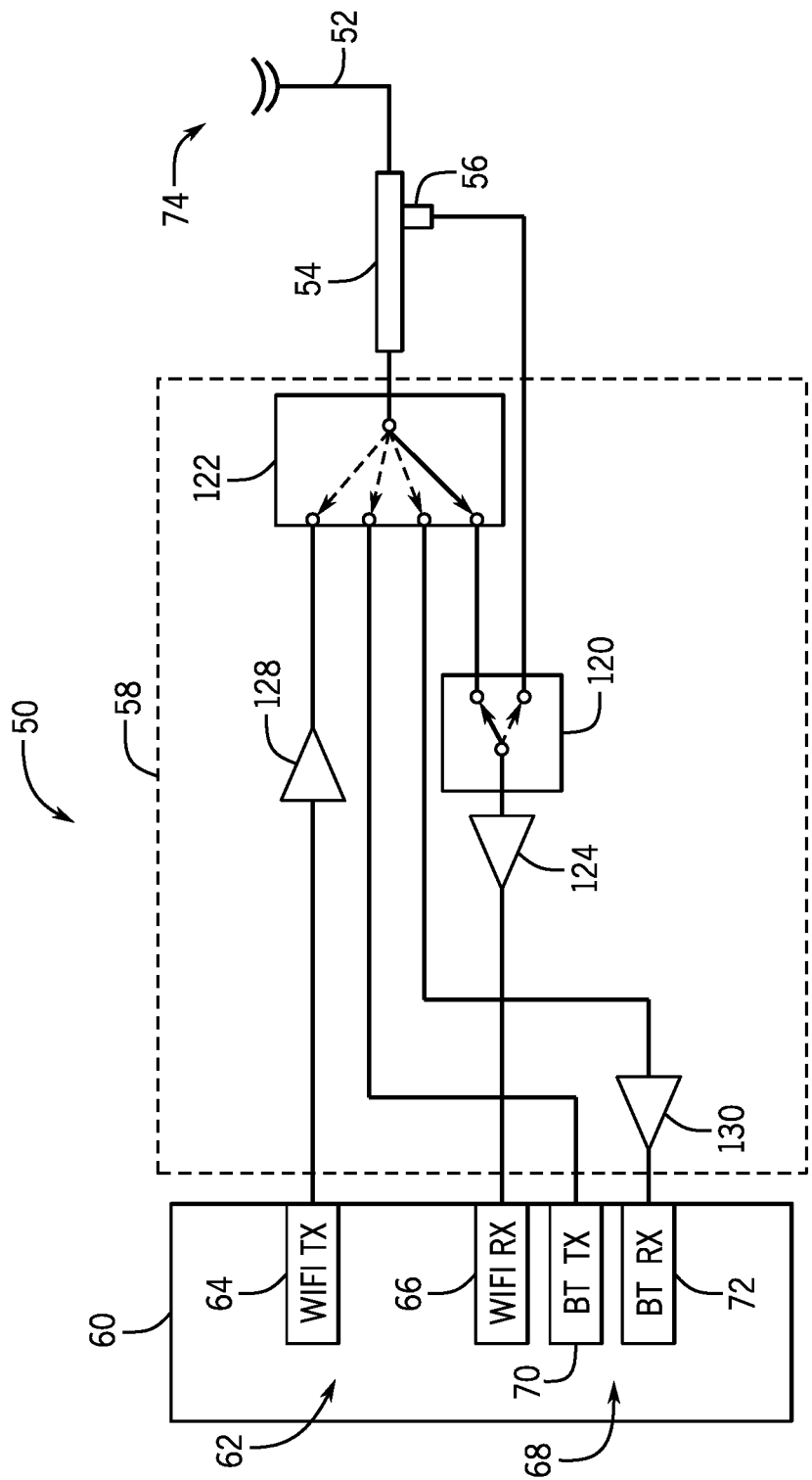
FIG. 16 is a schematic diagram of the system of FIG. 7, in accordance with an embodiment.

FIG. 16 is a schematic diagram of an embodiment of the system 50 that includes two switches and three amplifiers. As illustrated, the first switch 120 is a DPST switch, and the second switch 122 is a single pole, quadruple throw (SP4T) switch. The system 50 also includes the amplifiers 124, 128, 130. As described above, the amplifiers 124, 130 may be low noise amplifiers that amplify the signals received by the receivers 66, 72, respectively. Moreover, the amplifier 128 may amplify signals sent by the transmitter 64.

Figure 17:
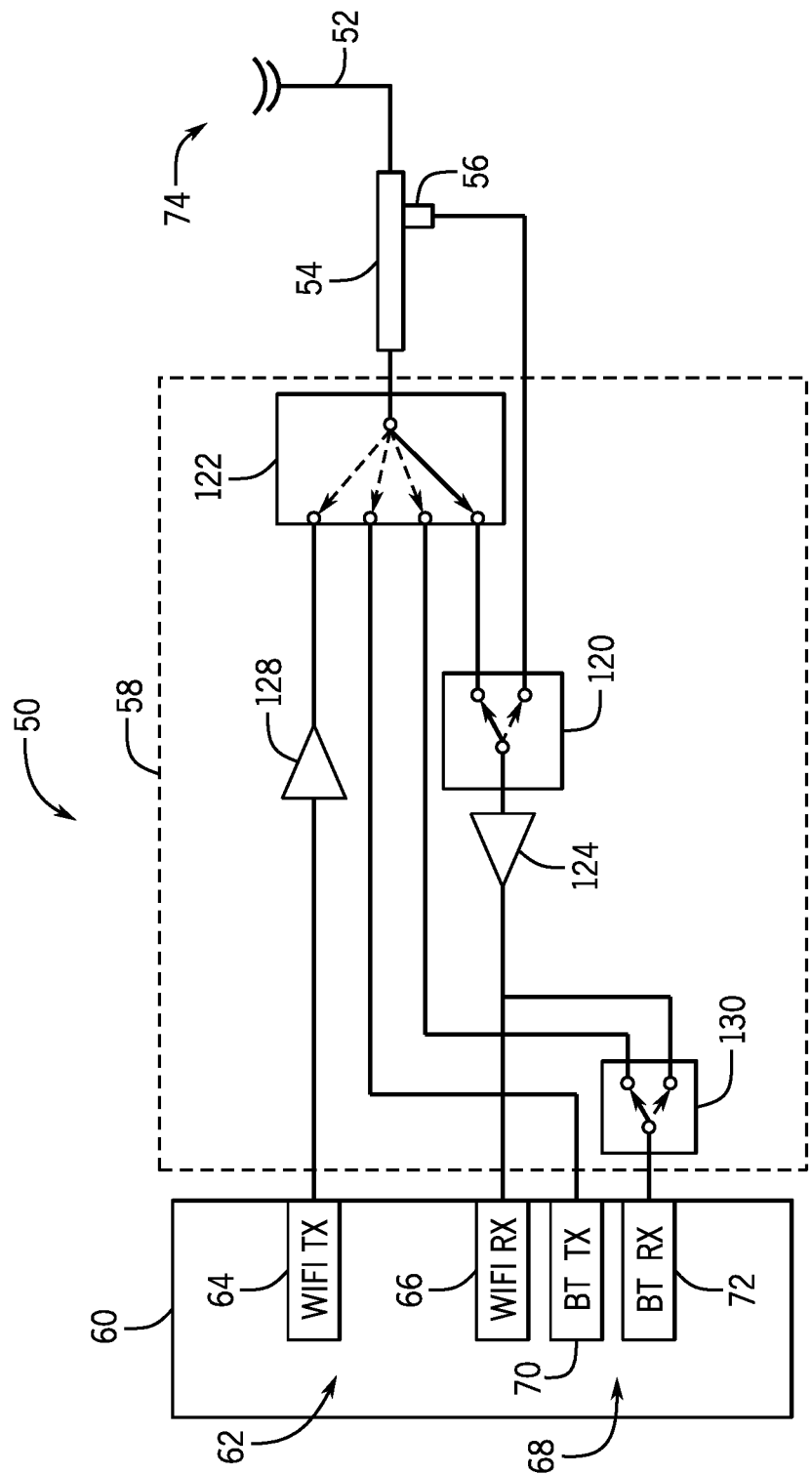
FIG. 17 is a schematic diagram of the system of FIG. 7, in accordance with an embodiment.

A similar configuration that uses one less amplifier and one more switch may also be used. For instance, FIG. 17 is a schematic diagram of an embodiment of the system 50 that includes three switches and two amplifiers. As illustrated, the first switch 120 is a DPST switch, the second switch 122 is a SP4T switch, and the third switch 126 is a DPST switch. Additionally, the amplifiers 124, 128 are included. Signals to be received by the receivers 66, 72 may be amplified by the amplifier 124, and signals sent by the transmitter 64 may be amplified by the amplifier 128.

Figure 18:
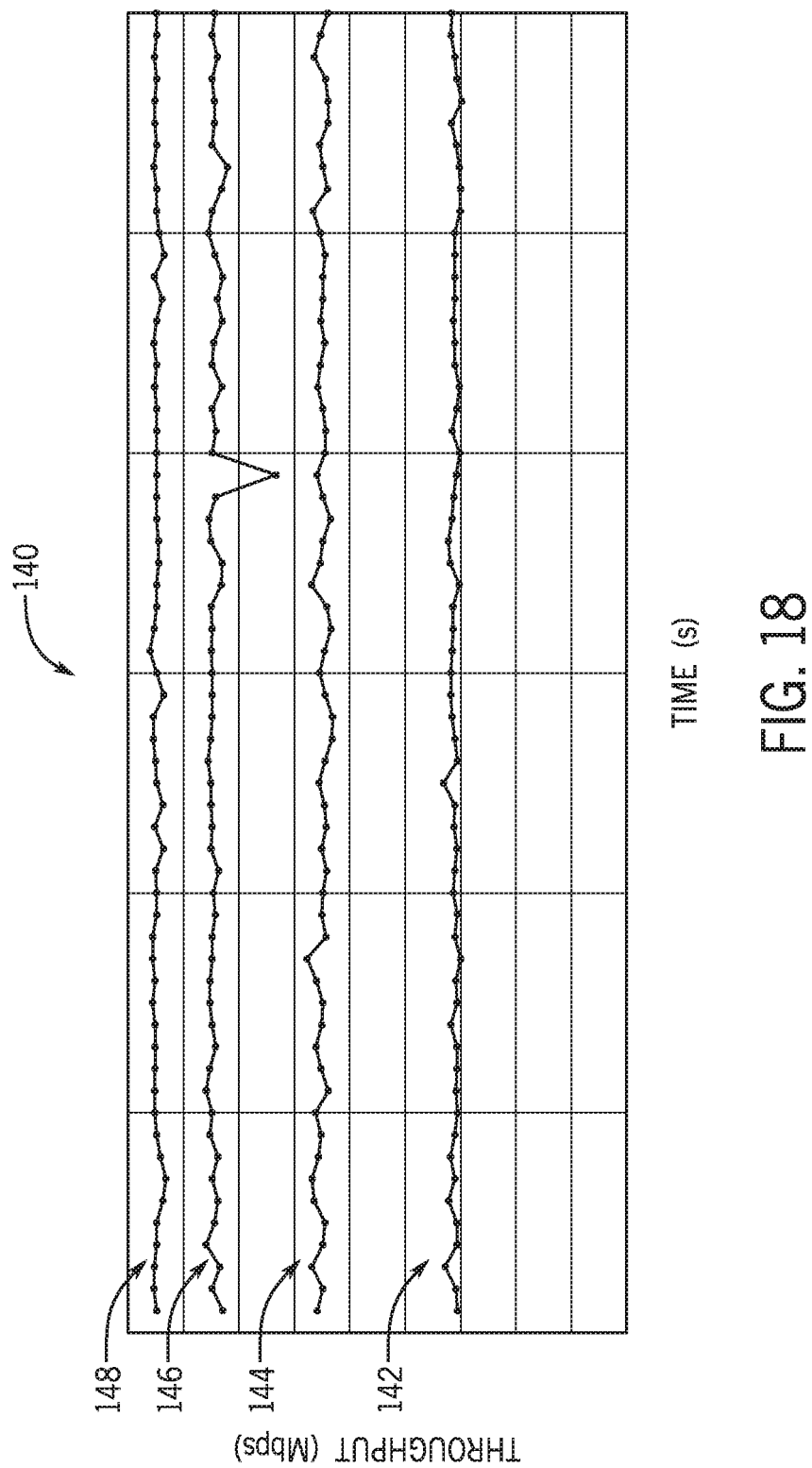
FIG. 18 is a graph of wireless throughput over time, in accordance with an embodiment.

FIG. 18 is a graph 140 showing wireless throughput versus time. A first line 142 and second line 144 illustrate the throughput achieved by an electronic device that does not include the coupler 56. More specifically, first line 142 is illustrative of the device being affected by variation in RSSI and noise (e.g., produced by a Bluetooth transmitter), and the second line 144 shows a device that is only impacted by RSSI variation. The graph also includes a third line 146 and a fourth line 148, both of which are associated with devices that include the coupler 56 discussed above. More specifically, the third line 146 shows a device that is only impacted by noise variation, and the fourth line 148 shows a device that is not impacted by RSSI variation or noise variation. As shown in the graph 140, each of the lines 144, 146, 148 has a higher throughput than the line 142. That is, inclusion of the coupler 156 allows for a higher throughput in comparison to devices that do not include the coupler 156.

Figure 19:
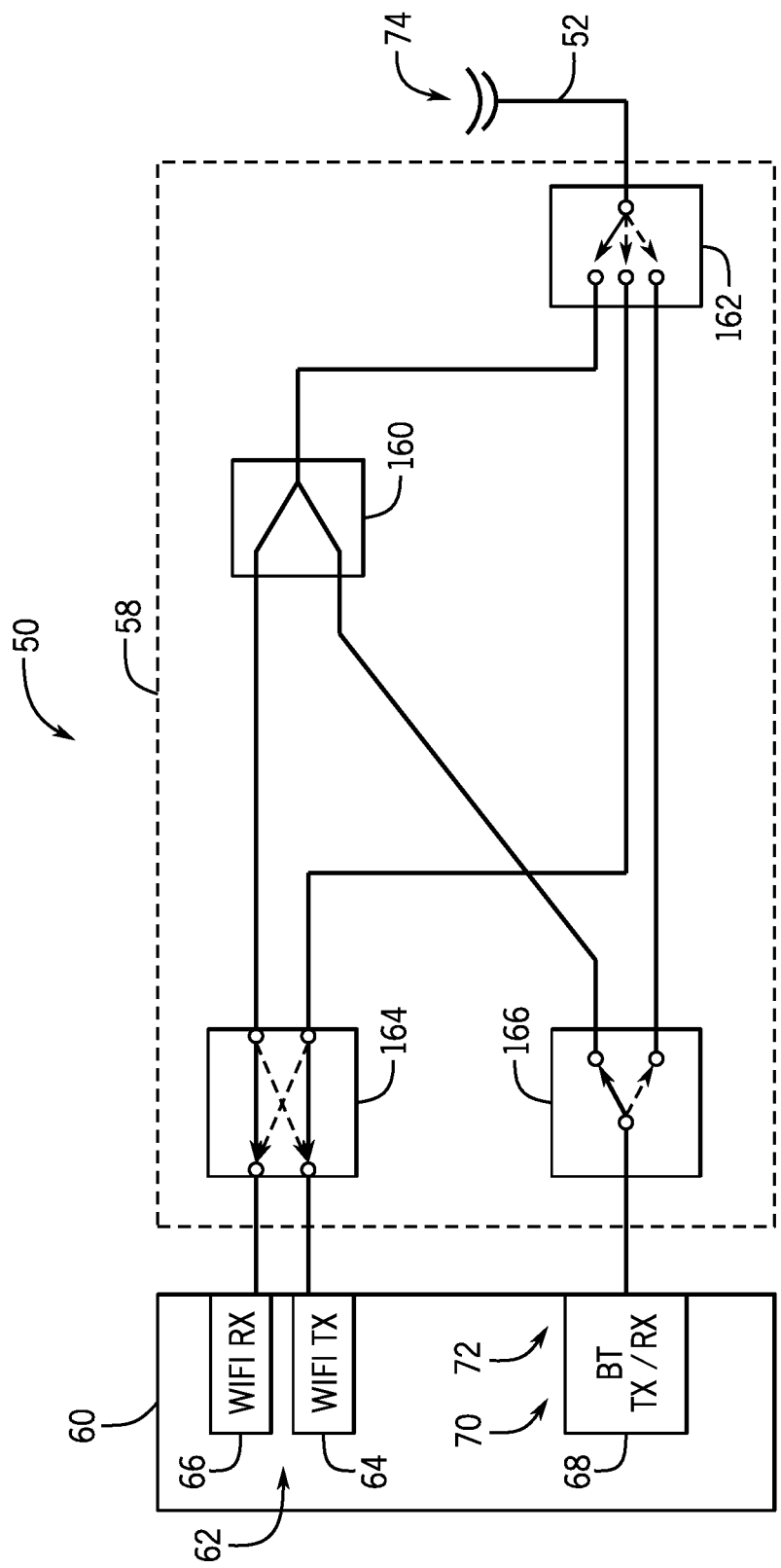
FIG. 19 is a schematic diagram of a system that enables the electronic device of FIG. 1 to communicate wirelessly, in accordance with an embodiment.

While the embodiments discussed above include the antenna port 54 and coupler 56, it should be noted that a divider may also be used instead. For example, FIG. 19 is a schematic diagram of the system 50 that includes a divider 160. The electromagnetic radiation 74 received by the antenna 52 may be converted electrical signals, which may pass through a first switch 162 before being split by the divider 160. The split signals may then be received by the receivers 66, 72 after passing through a second switch 164 and a third switch 166, respectively. In the illustrated embodiment, the first switch 162 is a SP3T switch, the second switch 164 is a DPDT switch, and the third switch 166 is a DPST switch. Additionally, one or more amplifiers may be included. For example, an amplifier could be placed between the divider 160 and the first switch 162 to amplify received signals.

Implementation of the embodiment of the system 50 illustrated in FIG. 19 results in less of a decrease in Wi-Fi signal-to-noise ratio when Bluetooth and Wi-Fi communication occur simultaneously. For instance, compared to the −25 decibel change in signal-to-noise ratio that could occur in other systems when Wi-Fi communication and a Bluetooth receiver (e.g., receiver 72) are simultaneously active, the system 50 of FIG. 19 has a change in signal-to-noise ratio of −3 decibels when the divider 160 has a coupling factor of −3 decibels. Additionally, when Wi-Fi communication is active and a Bluetooth transmitter (e.g., transmitter 70) is active, the signal-to-noise ratio may decrease by 28 decibels when the divider 160 has a coupling factor of −3 decibels. Without the divider 160, the change in signal-to-noise ratio could otherwise be −50 decibels.

As another example, when a divider 160 is not included, there could be a −25 fluctuation in Wi-Fi RSSI when the communication system (e.g., second communication system 68) that enables Bluetooth communication is idle. However, when the coupler 56 is utilized, such as in the embodiments shown in FIGS. 7-9, the fluctuation in Wi-Fi RSSI may be equal to the coupling factor of the divider 160. For instance, if the divider 160 has a coupling factor of −3 decibels, the fluctuation in Wi-Fi RSSI may be −3 decibels.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising communication circuitry, wherein the communication circuitry comprises:
    an antenna configured to transmit and receive electromagnetic radiation;
    an antenna port configured to provide primary access to the antenna with a first attenuation via an antenna port input;
    a coupler attached to the antenna port, wherein the coupler is configured to provide secondary access to the antenna with a second attenuation;
    a first communication system and a second communication system, wherein the first and second communication systems are configured to transmit and receive signals; and
    routing circuitry communicatively coupled to the antenna port, the coupler, and the first and second communication systems, wherein:
        the routing circuitry comprises:
            a double pole, double throw switch that is communicatively coupled to the first communication system and the coupler; and
            a single pole, double throw switch that is communicatively coupled to the second communication system and the antenna port;
        wherein
        the routing circuitry is configured to:
            route communication through the antenna port when only one of the first and second communication systems is active; and
            route communication by the first communication system through the coupler and communication by the second communication system through the antenna port when the first and second communication systems are both transmitting or both receiving signals.

2. The electronic device of claim 1, wherein:
one of the first communication system and the second communication system comprises a unit comprising a first transmitter and first receiver; and
another of the first communication system and the second communication system comprises a second transmitter that is separate from a second receiver.

3. The electronic device of claim 2, wherein:
the first communication system is associated with a wireless local area network and comprises the second transmitter and second receiver; and
the second communication system is associated with a personal area network and comprises the first transmitter and first receiver.

4. The electronic device of claim 1, wherein the coupler comprises a coupling factor of −6 or −10 decibels.

5. The electronic device of claim 1, wherein the routing circuitry comprises an amplifier configured to amplify signals sent or received by the first communication system.

6. The electronic device of claim 5, wherein the amplifier is a low noise amplifier.

7. An electronic device comprising communication circuitry, wherein the communication circuitry comprises:
an antenna configured to transmit and receive electromagnetic radiation;
an antenna port configured to provide primary access to the antenna with a first attenuation via an antenna port input;
a coupler attached to the antenna port, wherein the coupler is configured to provide secondary access to the antenna with a second attenuation;
a first communication system and a second communication system, wherein first and second communication systems are configured to transmit and receive signals; and
routing circuitry communicatively coupled to the antenna port, the coupler, and the first and second communication systems, wherein the routing circuitry comprises a first switch that is communicatively coupled to the first communication system and the coupler and a second switch that is communicatively coupled to the second communication system and the antenna port, wherein:
the first switch comprises a double pole, double throw switch;
the second switch comprises a single pole, double throw switch; wherein
the routing circuitry is configured to:
route communication through the antenna port when only one of the first and second communication systems is active; and
route communication of the first communication system through the coupler and communication of the second communication system through the antenna port when the first and second communication systems are both transmitting signals or both receiving signals.

8. The electronic device of claim 7, wherein the first switch is communicatively coupled to the second switch.

9. The electronic device of claim 7, wherein:
the first communication system is associated with a wireless local area network; and
the second communication system is associated with a personal area network.

10. The electronic device of claim 7, wherein the coupler is communicatively coupled to the antenna via the antenna port.

11. The electronic device of claim 7, wherein the first switch is communicatively coupled to the antenna port and the coupler.

12. The electronic device of claim 11, wherein the first switch is communicatively coupled to the antenna port via the second switch.

13. The electronic device of claim 12, wherein:
the first communication system is associated with a wireless local area network; and
the second communication system is associated with a personal area network.

14. The electronic device of claim 13, wherein:
the first communication system comprises a first transmitter and a first receiver, wherein the first transmitter is separate from the first receiver; and
the second communication system comprises a unit comprising a second transmitter and a second receiver.

15. A method comprising:
when only a first communication system of communication circuitry of an electronic device is active, routing communication by the first communication system through a first switch and an antenna port input of an antenna port of the electronic device to access an antenna of the electronic device, wherein the antenna is configured to transmit and receive electromagnetic radiation, wherein the first switch comprises a single throw, double pole switch, and wherein the antenna port is configured to provide primary access to the antenna with a first attenuation via the antenna port input;
when only a second communication system of the communication circuitry of the electronic device is active, routing communication by the second communication system through the first switch and the antenna port input of the antenna port to access the antenna of the electronic device; and
when the first communication system and the second communication system are both transmitting signals or both receiving signals:
routing communication by the first communication system through a second switch and a coupler of the electronic device, wherein the coupler is attached to the antenna port and configured to provide secondary access to the antenna of the electronic device with a second attenuation, and wherein the second switch comprises a double pole, double throw switch; and
routing communication by the second communication system through the first switch and the antenna port input of the antenna port to access the antenna of the electronic device.

16. The method of claim 15, wherein the second attenuation differs from the first attenuation by ten decibels or less.

17. The method of claim 15, wherein the electronic device comprises a computer, phone, or wearable electronic device.

18. The method of claim 15, wherein:
the first communication system is associated with a wireless local area network; and
the second communication system is associated with a personal area network.

19. The electronic device of claim 1, wherein the routing circuitry comprises a double pole, single throw switch that is communicatively coupled to the second communication system.

20. The electronic device of claim 19, wherein the double pole, single throw switch is communicatively coupled to the single throw, double pole switch and the double pole, double throw switch.

* * * * *